United States Patent [19]

Shappir

[11] 4,180,826

[45] Dec. 25, 1979

[54] MOS DOUBLE POLYSILICON READ-ONLY MEMORY AND CELL

[75] Inventor: Joseph Shappir, San Jose, Calif.

[73] Assignee: Intel Corporation, Santa Clara, Calif.

[21] Appl. No.: 907,557

[22] Filed: May 19, 1978

[51] Int. Cl.² .......................................... H01L 27/04
[52] U.S. Cl. ...................................... 357/41; 357/23; 357/45; 357/59; 365/104; 29/571; 29/578; 29/580
[58] Field of Search .................. 357/41, 45, 59, 23; 365/104

[56] References Cited

U.S. PATENT DOCUMENTS

| | | | |
|---|---|---|---|
| 4,012,757 | 3/1977 | Koo | 357/41 |
| 4,016,587 | 4/1977 | De La Moneda | 357/23 |
| 4,075,045 | 2/1978 | Rideout | 357/59 |
| 4,095,251 | 6/1978 | Dennard et al. | 357/45 |
| 4,142,926 | 3/1979 | Morgan | 357/59 |

Primary Examiner—William D. Larkins
Attorney, Agent, or Firm—Blakely, Sokoloff, Taylor & Zafman

[57] ABSTRACT

A high density, read-only, mask programmed memory and memory cell fabricated with two layers of polycrystalline silicon (polysilicon) is disclosed. Elongated doped substrate regions form source/drain regions for the cells and are used as bit lines for the memory. The first layer of polysilicon defines gates for the cells; the second layer of polysilicon defines transverse work lines. Programming consists of selective contacts between the first and second layers of polysilicon over the active regions of the cells. A cell area of approximately 0.125 mils² is realized.

11 Claims, 12 Drawing Figures

MOS DOUBLE POLYSILICON READ-ONLY MEMORY AND CELL

BACKGROUND OF THE INVENTION

1. Field of the Invention

The invention relates to the field of MOS read-only memories and their cells.

2. Prior Art

Numerous metal-oxide-semiconductor (MOS) read-only memories (ROMs) are well-known and commercially available. These ROMs generally fall into two categories, mask programmed ROMs and user programmed memories (PROMs). In the latter category, fusible links are used in memories which may only be programmed once, whereas silicon nitride layers or floating gate devices are used in erasable PROMs (EPROMs).

The mask programmed ROMs have the obvious disadvantage of storing only one predetermined program which is permanently imbedded in the memory. However, these devices have the advantage of lower cost, particularly in high production, when compared to PROMs.

Most often, mask programmed ROMs employ metal contacts to define the program. A special mask is generated based on the user's program and used to define these metal contacts near the end of the fabrication process. These "metal contact" ROMs are able to be nearly fully-fabricated before the metal contact mask is required, thus, partially completed wafers may be produced and stored. These memories, however, have the disadvantage of requiring a relatively large substrate area because of the metal contacts.

Another type of mask programmed ROM which has been proposed employs ion implanted regions in the substrate to define the program. Essentially, selected cells are made into depletion mode devices by ion implantation to store one of the binary states. While this memory requires substantially less substrate area than the "metal contact" ROMs, it is more difficult to fabricate because it requires large amounts of ion implantation. Moreover, the program must be implanted into the substrate at a very early stage of production.

The memory cells of the present invention employ double layer polysilicon technology; no metallization is required. The cells are of relatively small area; thus, much higher density ROMs are possible than with prior art cells with the same design rules. By way of example, a 64K ROM on a 100 mil × 100 mil chip is realizable.

SUMMARY OF THE INVENTION

A pair of MOS memory cells for a read-only memory formed on a silicon substrate where one of the cells is programmed with one binary state and the other with the other binary state is described. A pair of spaced-apart, elongated, doped regions is formed in the substrate; these regions define source and drain regions for the cells. A first polysilicon line, insulated from the substrate, extends generally between these elongated doped regions. This line includes a discontinuity which forms an isolated section of the line. A pair of second polysilicon lines, disposed generally above the first line, extends transverse to this first line. One of the second lines contacts the isolated section of the first line and the other of the second lines is insulated from the first line. In this manner, one cell stores can binary state, and the other cell the other binary state.

BRIEF DESCRIPTION OF THE DRAWINGS

FIG. 4 is a cross-sectional elevation view of a substrate with several layers formed on one surface of the substrate.

FIG. 5 illustrates the substrate of FIG. 4 after several etching steps and a diffusion step which is used to define the bit lines in the memory.

FIG. 6 illustrates the substrate of FIG. 5 after the contact mask step which is used to define the program.

FIG. 7 illustrates the substrate of FIG. 6 after an oxide layer is formed on the substrate and on part of the first layer of polysilicon.

FIG. 8 illustrates the substrate of FIG. 7 after a second layer of polysilicon is formed on the substrate.

FIG. 9 is a transverse section of the substrate of FIG. 8 used to illustrate the etching step which defines an isolated section in the first polysilicon line.

FIG. 10 illustrates the substrate of FIG. 9 during an ion implantation step used to form channel stops.

DETAILED DESCRIPTION OF THE INVENTION

MOS memory cells for an integrated circuit read-only memory and a memory employing such cells are described. The described memory cells and memory provide a very high density memory when compared to prior art read-only memory cells. In the following description, numerous specific details are given such as specific conductivity types, thicknesses, etc., in order to provide a thorough understanding of the present invention. It will be obvious to one skilled in the art, however, that the invention may be practiced without these specific details. In other instances, well-known steps and circuits are not shown in order not to obscure the present invention in unnecessary detail.

Figure 1:
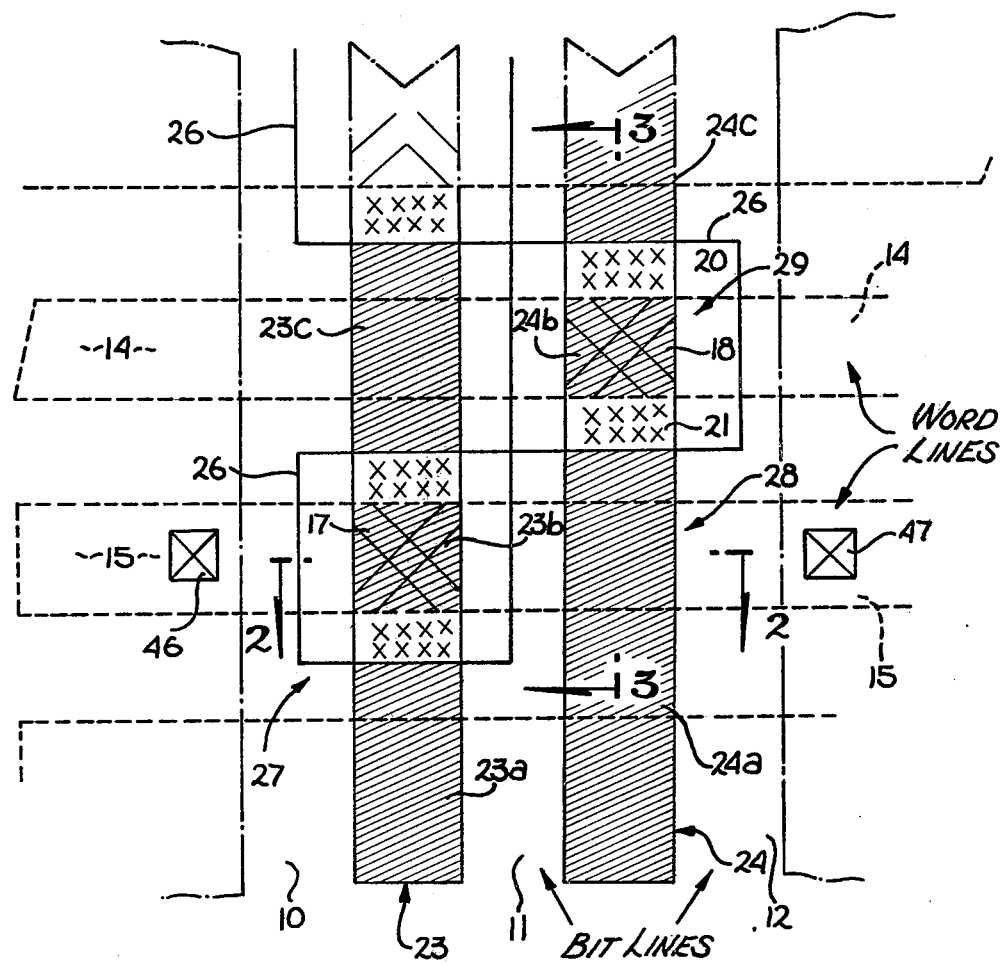
FIG. 1 is a plan view of a portion of a read-only memory fabricated in accordance with the present invention.

Referring to FIG. 1, the general layout of the memory is illustrated along with outlines of the masks employed to fabricate the memory. In general, the memory includes a plurality of parallel, spaced-apart bit lines. The lines are formed from elongated doped regions in the substrate, such as lines 10, 11 and 12 of FIG. 1. These doped regions are also source and drain regions for the cells. The bit lines are formed in alignment with first level polysilicon lines which are disposed generally between the bit lines such as the parallel polysilicon lines 23 and 24. As will be explained in greater detail, these lines are not continuous, but rather have discontinuities or breaks. Thus, there are sections of a polysilicon line which are isolated from other sections of a line. Line sections 23a, 23b and 23c, along with line sections 24a, 24b and 24c, are identified in FIG. 1.

The word lines of the array consist of parallel, spaced-apart, second level polysilicon lines which are generally perpendicular to the bit lines and first level polysilicon lines. Word lines 14 and 15 are shown in FIG. 1.

The cells in the memory which are programmed with one binary state have their gates, which are defined by the first polysilicon lines, in direct contact with the overlying word line. Those memory cells which are programmed with the other binary state have insulation disposed between their gates and the overlying word line.

Figure 2:
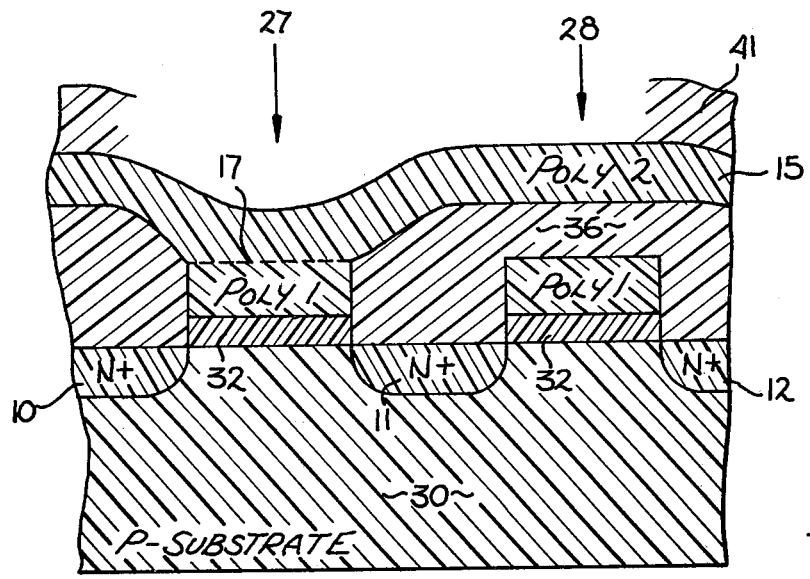
FIG. 2 is a cross-sectional elevation view of a pair of adjacent memory cells for the memory of FIG. 1 taken generally through section line 2—2 of FIG. 1.

In FIG. 2, two adjacent memory cells 27 and 28 are illustrated, one programmed with one binary state and the other, with the other binary state. The polysilicon sections 23b and 24a form gates for their respective cells which are insulated from the active channel of each of these cells by a gate oxide layer 32. The cell 27 includes the doped regions/lines 10 and 11, which as mentioned, are both source/drain regions for the cell and bit lines of the memory. Similarly, the cell 28 includes the regions/lines 11 and 12. The word line 15, formed from the second layer of polysilicon, is shown crossing both of these cells. In the case of cell 27, the first level polysilicon secton 23b is in direct contact with the line 15 at contact region 17. In the case of the cell 28, the polysilicon section 24a is spaced-apart and insulated from the line 15 by the silicon dioxide layer 36. An overlying protective glass layer 41 is also illustrated in FIG. 2.

The presence or absence of the contact region 17 between the polysilicon line 15 and the first level polysilicon sections is detectable. For example, by applying appropriate potentials to (or by placing charges on) the bit lines, and by applying a potential to the word line 15, it can readily be determined that cell 27 is more conductive than the cell 28. Note that in the cell 28, the potential applied to line 15 is only capacitively coupled to the section 24a through the oxide layer 36, whereas in cell 27, this potential is directly applied to section 23b. Thus, the "program" in the memory is detected by sensing the relative characteristics of the cells, which characteristics are set by the presence or absence of contact between the first and second polysilicon layers.

Figure 3:
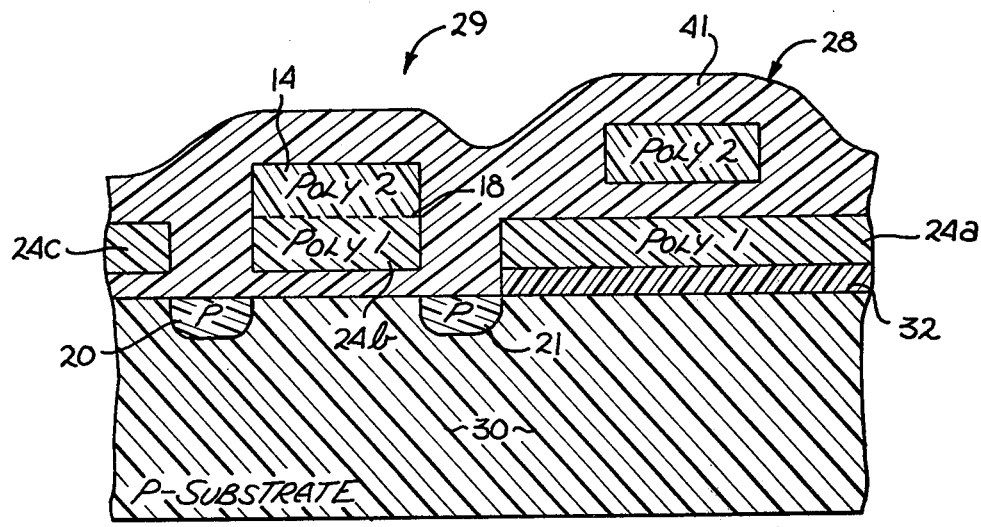
FIG. 3 is a cross-sectional elevation view of a pair of adjacent memory cells for the memory of FIG. 1 taken generally through section line 3—3 of FIG. 1.

In FIG. 3, the cross-sectional view of the pair of adjacent cells 28 and 29 is in a transverse direction to the view of FIG. 2. In this view, the isolated section 24b of the first polysilicon line 24 is more clearly seen; this section is isolated from the sections 24a and 24c. The section 24b is in contact with the overlying word line 14 at contact region 18 to program cell 29 with one binary state. Cell 28 is programmed with the other binary state as is clearly shown by the presence of oxide layer 36. In the presently preferred embodiment, p-type channel stops such as formed by the p-type regions 20 and 21 are implanted along opposite sides of the polysilicon section 24b to prevent parasitic channelling.

The presently preferred process for forming the contact region between the first and second layer of polysilicon, such as the contact regions 17 and 18 of FIGS. 2 and 3, respectively, is described in copending application Ser. No. 890,139, filed Mar. 27, 1978, entitled "PROCESS FOR FORMING A CONTACT REGION BETWEEN LAYERS OF POLYSILICON" and assigned to the assignee of this application.

Figure 4:
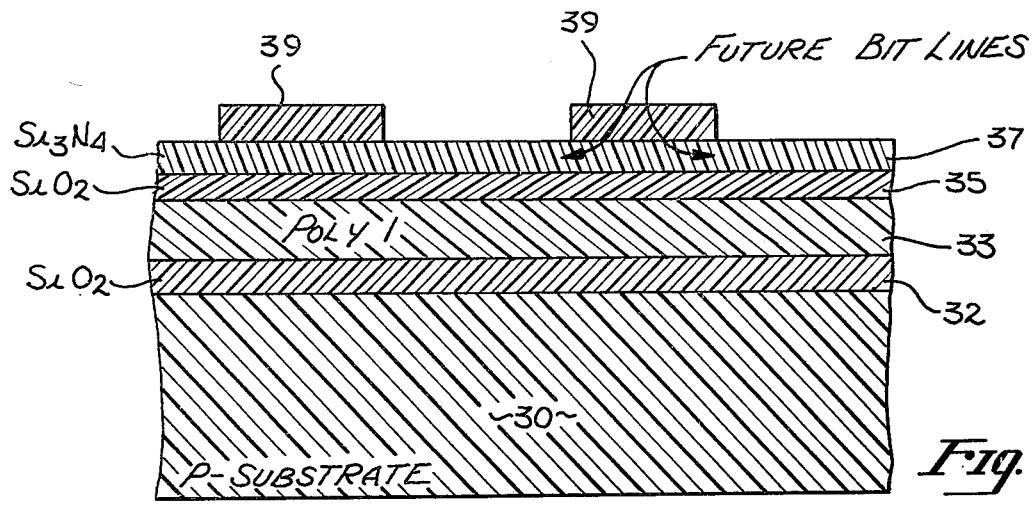
FIGS. 4 through 10 illustrate various processing steps employed in the presently preferred process for fabricating the memory of FIG. 1.

The presently preferred process for fabricating the memory and cells of the present invention begins with a p-type substrate 30 (FIG. 4). A gate oxide layer 32 is grown on the substrate to a thickness of approximately 750 Å. A first layer of polysilicon 33 is next formed on this gate oxide layer in an ordinary manner. In the presently preferred embodiment, this polysilicon layer is approximately 6,000 Å thick. A second oxide layer 35 is grown on the upper surface of layer 33 to a thickness of between 250 Å to 750 Å. Then, a layer of silicon nitride 37 of approximately 1,000 Å thick is formed on the layer 35.

The first step illustrated in FIG. 4 for forming the memory and cells is to define the first level polysilicon lines, such as lines 23 and 24 of FIG. 1 from the polysilicon layer 33. A mask is employed to define the photoresist members 39 shown in FIG. 4. (Note depending upon the masking techniques employed, members 39 may be oxide members.) The mask used to form these first level polysilicon lines are outlined in the plan view of FIG. 1 (Poly 1 Mask).

Figure 5:
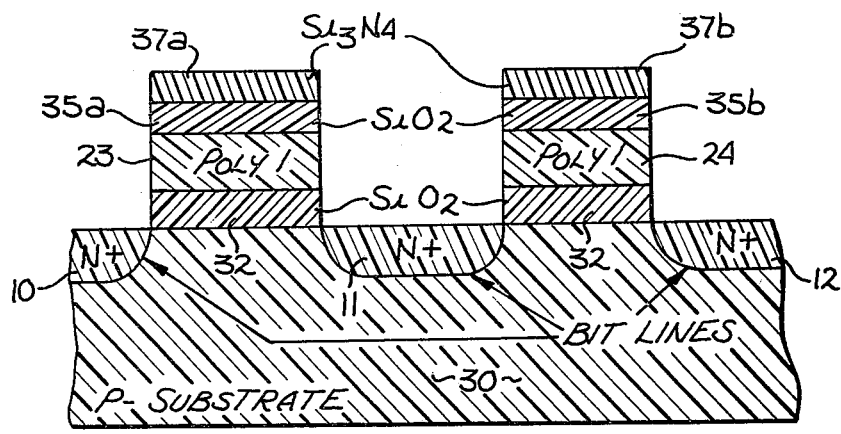

Next, the silicon nitride layer 37, silicon dioxide layer 35, polysilicon layer 33 and gate oxide layer 32 are each etched with well-known etchants as may be seen in FIG. 5. Following this, an ordinary doping step is employed to form the bit lines 10, 11 and 12, which lines are formed in alignment with the polysilicon lines 23 and 24. An ordinary n-type dopant, such as phosphorus or arsenic, may be employed to form these lines.

Figure 6:
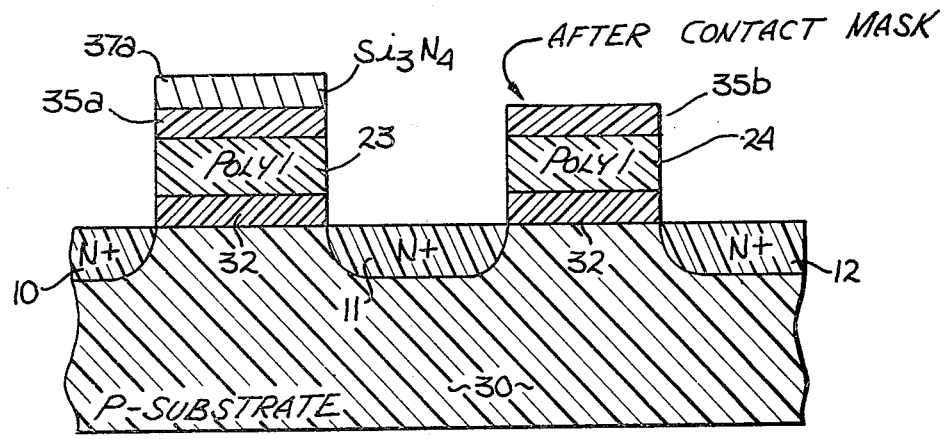

Now, the program mask, or contact mask, which defines the program for the memory is used. As will be apparent, this mask may be readily generated once a specific program is known. The contact mask is shown by the solid lines in FIG. 1 which define the areas 96. This masking step and subsequent etch remove all the silicon nitride except above those cells where contact is to be made between the first and second layers of polysilicon. In FIG. 6, this is illustrated by the fact that no silicon nitride is shown above the line 24; that is, the nitride member 37b of FIG. 5 has been removed. The silicon nitride member 37a, however, remains above line 23 since contact will be made below this member with line 23.

Figure 7:
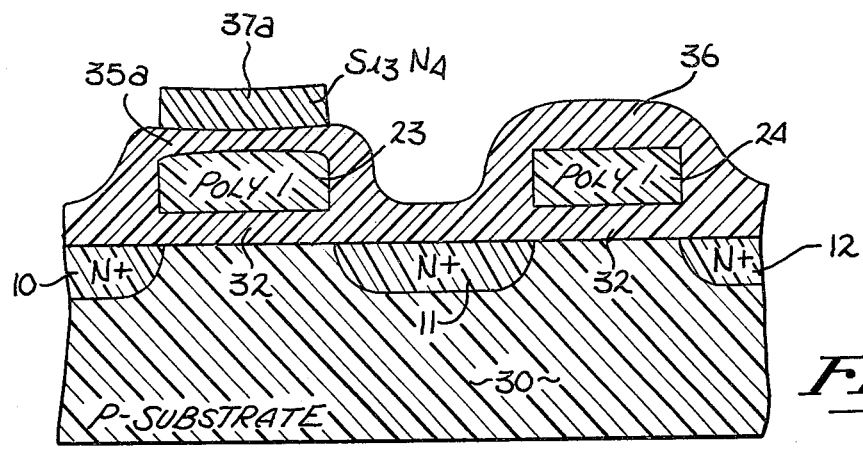

A relatively thick silicon dioxide layer of between 2,000–3,500 Å is next formed on the substrate. As shown in FIG. 7, the oxide layer 36 is grown over the entire substrate except under the member 37a. As is known, the silicon nitride member 37a prevents the growth of an oxide.

Figure 8:
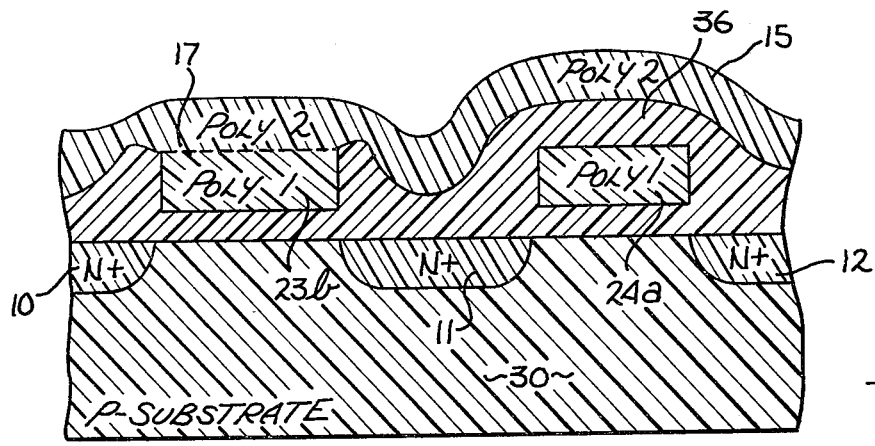

The silicon nitride member 37a and the other such silicon nitride members may now be removed employing an ordinary etchant. A relatively light, hydrofluoric acid dip is used to remove the oxide layer 35 such that the first layer of polysilicon is exposed below those regions which were previously covered by the silicon nitride members. This dip is not sufficient to remove the relatively thick oxide layer 36. The second layer of polysilicon is next formed as shown in FIG. 8. This layer is in contact with the first layer polysilicon lines at the predetermined regions such as contact region 17 of FIG. 8. The second layer of polysilicon is then masked and etched to define the word lines such as lines 14 and 15 of FIG. 1.

Figure 9:
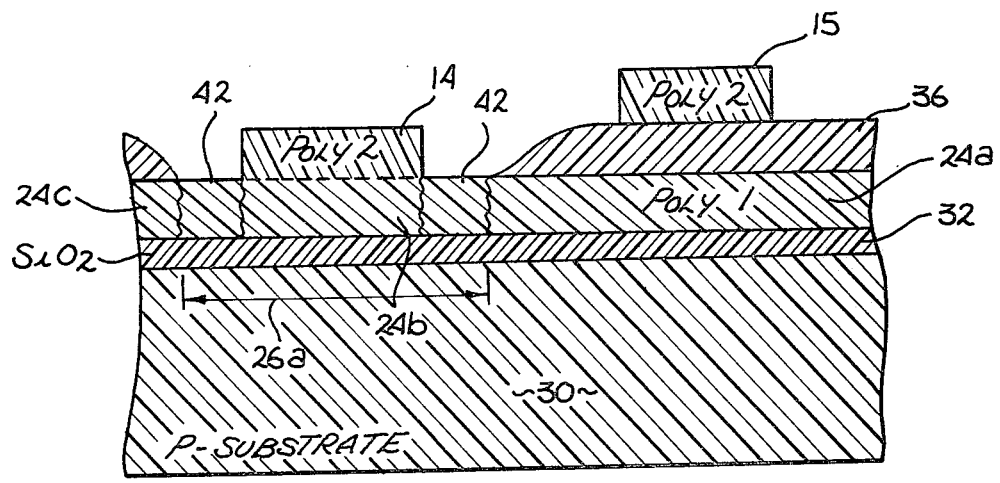

Referring to the cross-sectional view of FIG. 9, in this transverse view the exposed first layer polysilicon resulting from the masking of areas 26 is shown by the dimension 26a. Word line 14 is formed within dimension 26a. When line 14 is etched, the exposed underlying first layer of polysilicon is likewise etched to form the gaps 42 of FIG. 9. These gaps (and the corresponding gaps in other cells) form the isolated sections 24a, 24b and 24c of FIG. 9.

Figure 10:
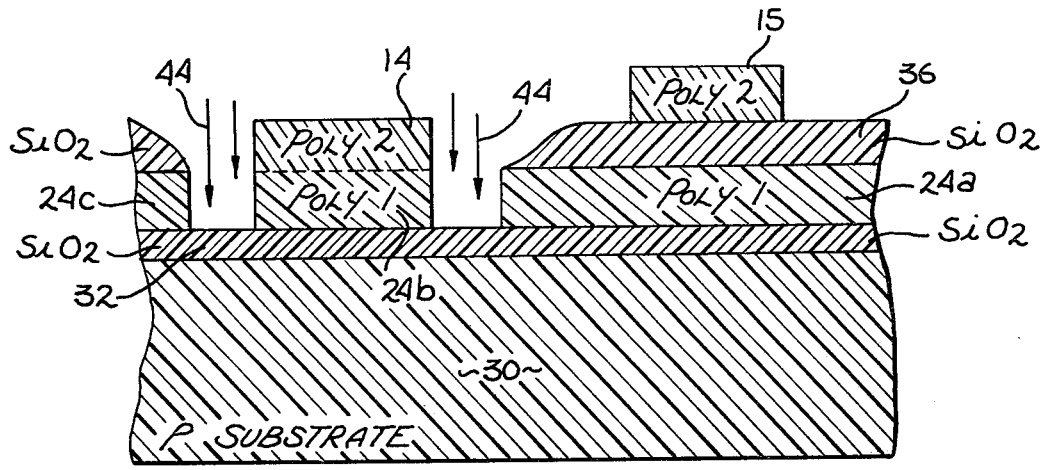

As shown by the lines 44 of FIG. 10, ion implantation of a p-type impurity such as boron, is employed to define the p-type channel stops 20 and 21 of FIG. 3. Note this implantation is done through the gate oxide layer; however, this layer is only exposed at the opposite sides of section 24b and like sections. Thus no masking is required to form these regions.

It should be mentioned that in the fabrication of the invented memory, only three masking steps are necessary. The first to define the first layer (level) polysilicon lines, the second to define the contacts (contact or program mask), and the third to define the second layer (level) polysilicon word lines. No metal lines are necessary.

An overlying, grounded, metal layer may be employed covering the entire memory array to prevent undesirable field inversion within the array where necessary instead of the boron implant. Or, overlying metal bit lines or word lines may be formed which are coupled to the underlying bit lines or word lines by metal contacts to decrease the propogation time along these underlying lines. For example, metal lines may be formed above the word lines 14 and 15 and may be coupled to these lines by dummy contacts such as contacts 46 and 47 (FIG. 1) to decrease the progogation time along with word lines. Other circuit leads formed from a metal layer may be routed over the memory cells where necessary.

Figure 11:
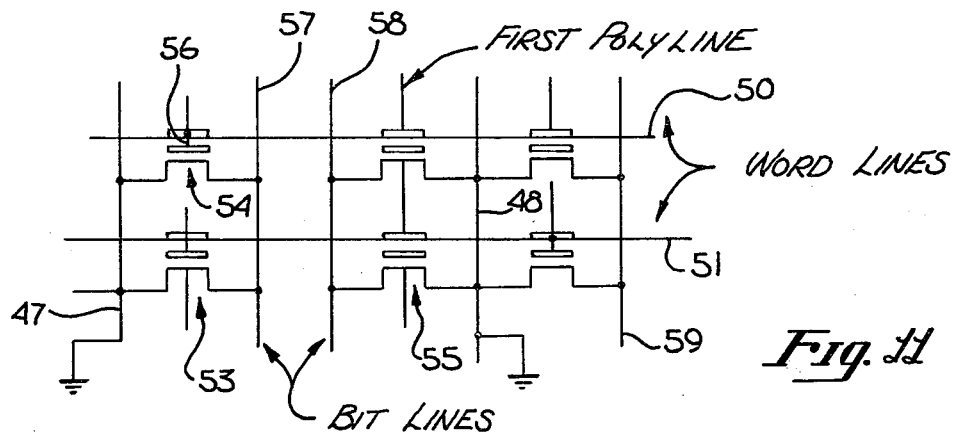
FIG. 11 is an electrical schematic illustrating one manner in which the invented cells may be employed in a memory.

Referring now to FIG. 11, word lines 50 and 51 correspond to word lines 14 and 15 of FIG. 1. A plurality of memory cells, such as cells 53, 54 and 55, are shown, all of which are identical to the above-described cells. Those cells where the first layer polysilicon sections are coupled to the word line are shown by a connection such as connection 56. For the embodiment of FIG. 11, extra bit lines are formed in the substrate between adjacent pairs of cells. For example, lines 57 and 58 are formed without intermediate cells. With this arrangement, the intermediate bit lines (lines 47 and 48) may be coupled to ground. Then sensing of the binary states of all the cells along a selected word line may occur.

Figure 12:
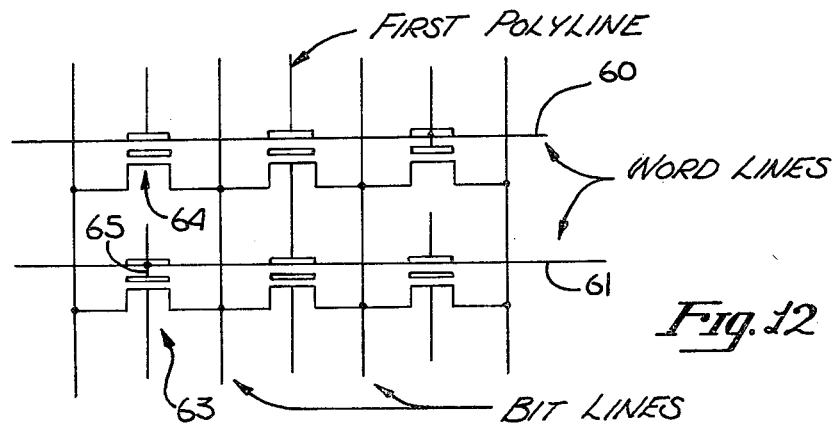
FIG. 12 is an electrical schematic illustrating an alternate manner in which the invented memory cells may be employed in a memory.

In FIG. 12, the intermediate bit lines are not employed, thus a more tightly knit array is possible. Again word lines, such as lines 60 and 61 pass over the first layer polysilicon sections of cell 63 and 64. A connection between the first level and second level polysilicon is shown, by way of example, by connection 65. To sense cells along a particular word line, a cell or group of cells along that word line are isolated by applying appropriate potentials (or charges) to the remaining bit lines, as is well-known.

Thus, a high density cell and a read-only memory have been described. The cells are programmed by contacts between the first layer and second layer polysilicon lines. With current MOS technology, a 64K ROM may be realized on a 100 mil × 100 mil chip with the invention.

I claim:

1. MOS memory cells for a read-only memory which store binary data, said cells formed on a silicon substrate, comprising:
   a pair of spaced-apart, elongated doped regions formed in said substrate, said doped regions forming source and drain regions for said cells;
   a first line of polysilicon insulated from said substrate extending generally between said doped regions, said first line including discontinuities forming isolated sections of said line for cells which store one binary state, said first line being continuous for cells which store the other binary state;
   a plurality of second lines of polysilicon disposed above said first line, said second lines generally transverse to said first line;
   said second lines associated with said cells which store said one binary state contacting said isolated sections of said first line to provide contact to said isolated sections, the others of said second lines insulated from said first line;
   whereby memory cells are formed, some programmed with said one binary state and the other cells with the other binary state.

2. The memory cells defined by claim 1 wherein said spaced-apart regions are parallel regions in alignment with said first line of polysilicon.

3. The memory cells defined by claim 2 wherein said second lines of polysilicon are parallel lines.

4. The memory cells defined by claim 1 wherein said elongated doped regions are bit lines in said memory and said second lines are word lines in said memory.

5. The memory cells defined by claim 1 including channel stops in said substrate adjacent to opposite sides of said isolated sections of said first line.

6. The memory cells defined by claim 1 wherein said substrate is a p-type substrate and said doped regions are n-type regions.

7. An MOS read-only memory formed on a silicon substrate comprising:
   a plurality of elongated, parallel, spaced-apart doped regions in said substrate, said doped regions forming source and drain regions for cells of said memory;
   a plurality of first level polysilicon lines insulated from said substrate disposed generally between said doped regions, said first lines including non-continuous sections at cells programmed with one binary state, and said first lines being continuous at cells programmed with the other binary state;
   a plurality of second level parallel, spaced-apart polysilicon lines disposed over said first lines, said second lines generally transverse to said doped regions;
   said second lines contacting said non-continuous sections of said first lines, and said second lines insulated from said first lines at said cells programmed with said other binary state;
   whereby a dense, programmed read-only memory is realized.

8. The memory defined by claim 7 wherein said elongated regions form bit lines for said memory for sensing said states of said cells.

9. The memory defined by claim 7 wherein said substrate is a p-type substrate and said elongated regions are n-type regions.

10. The memory defined by claim 7 including channel stop regions in said substrate adjacent to said non-continuous sections of said first lines.

11. The memory defined by claim 7 including additional elongated doped regions which permits isolation of cells in said memory.

* * * * *